(12) United States Patent
Queitsch et al.

(10) Patent No.: US 12,501,669 B2
(45) Date of Patent: Dec. 16, 2025

(54) MESA CONTACT FOR MOS CONTROLLED POWER SEMICONDUCTOR DEVICE

(71) Applicant: Infineon Technologies AG, Neubiberg (DE)

(72) Inventors: Ute Queitsch, Dresden (DE); Roman Baburske, Otterfing (DE); Ingo Dirnstorfer, Dresden (DE); Hans-Juergen Thees, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 608 days.

(21) Appl. No.: 17/411,883

(22) Filed: Aug. 25, 2021

(65) Prior Publication Data
US 2022/0069079 A1    Mar. 3, 2022

(30) Foreign Application Priority Data
Aug. 26, 2020 (DE) .......................... 102020122264.5

(51) Int. Cl.
*H10D 64/27* (2025.01)
*H10D 62/10* (2025.01)
(Continued)

(52) U.S. Cl.
CPC ......... *H10D 62/116* (2025.01); *H10D 62/378* (2025.01); *H10D 62/393* (2025.01);
(Continued)

(58) Field of Classification Search
CPC ............ H01L 29/0653; H01L 29/1087; H01L 29/1095; H01L 29/41766; H01L 29/4236; H01L 29/7397; H10D 62/116; H10D 64/256; H10D 64/254; H10D 64/257; H10D 64/513; H10D 62/378; H10D 64/52; H10D 62/393; H10D 12/481; H10D 12/038; H10D 64/529
See application file for complete search history.

(56) References Cited

U.S. PATENT DOCUMENTS

2009/0001455 A1    1/2009  Thapar
2014/0252460 A1*   9/2014  Lee ..................... H01L 29/4236
                                                          438/270

(Continued)

*Primary Examiner* — Matthew C Landau
*Assistant Examiner* — David W Ward
(74) *Attorney, Agent, or Firm* — Murphy, Bilak & Homiller, PLLC

(57) ABSTRACT

A power semiconductor device includes: a first load terminal at a first side, a second load terminal, and a semiconductor body coupled to the load terminals and configured to conduct a load current between the load terminals; and trenches at the first side and extending into the semiconductor body along a vertical direction. Each trench includes a trench electrode insulated from the semiconductor body by a trench insulator. Two trenches spatially confine a mesa portion. A semiconductor source region and semiconductor body region are in the mesa portion. A contact plug extends from the first side into the mesa portion and is arranged: in contact with the source and body regions; in contact with the trench insulator of one of the two trenches that spatially confine the mesa portion; and spaced apart from the trench insulator of the other one of the two trenches that spatially confine the mesa portion.

17 Claims, 8 Drawing Sheets

(51) Int. Cl.
*H10D 62/17* (2025.01)
*H10D 64/23* (2025.01)
*H10D 12/00* (2025.01)

(52) U.S. Cl.
CPC ......... *H10D 64/256* (2025.01); *H10D 64/513* (2025.01); *H10D 12/481* (2025.01)

(56) References Cited

U.S. PATENT DOCUMENTS

| | | | |
|---|---|---|---|
| 2016/0300913 A1* | 10/2016 | Siemieniec | H01L 29/0696 |
| 2016/0359025 A1* | 12/2016 | Hosoya | H10D 12/481 |
| 2018/0366541 A1* | 12/2018 | Laven | H10D 30/668 |
| 2019/0123136 A1* | 4/2019 | Lee | H10D 62/393 |
| 2019/0214490 A1* | 7/2019 | Leendertz | H10D 64/513 |
| 2022/0020876 A1* | 1/2022 | Mauder | H01L 29/66348 |

* cited by examiner

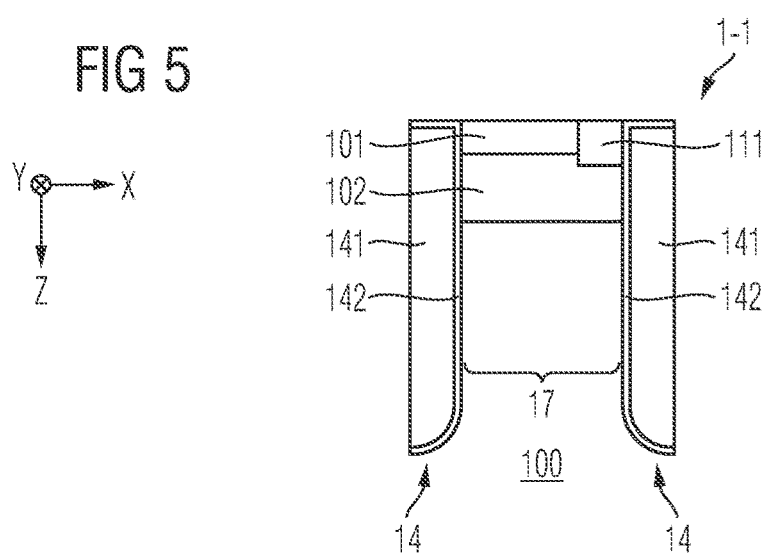
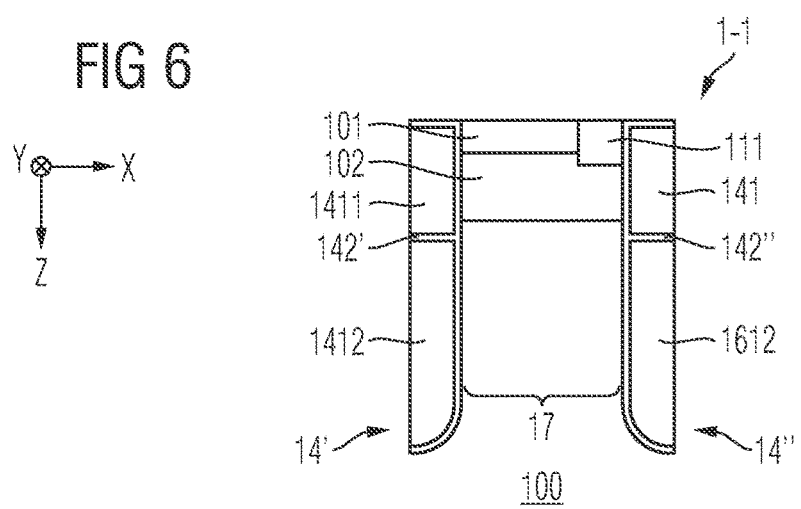
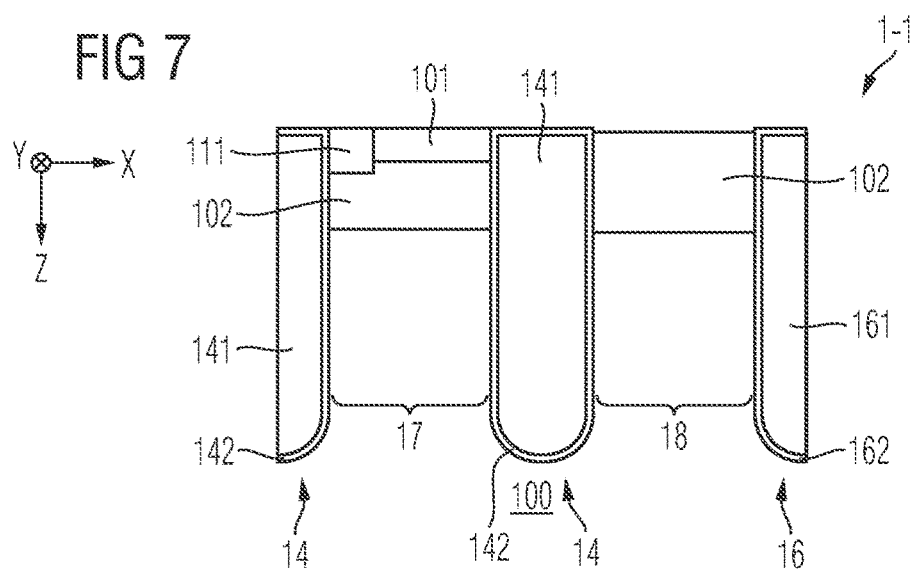

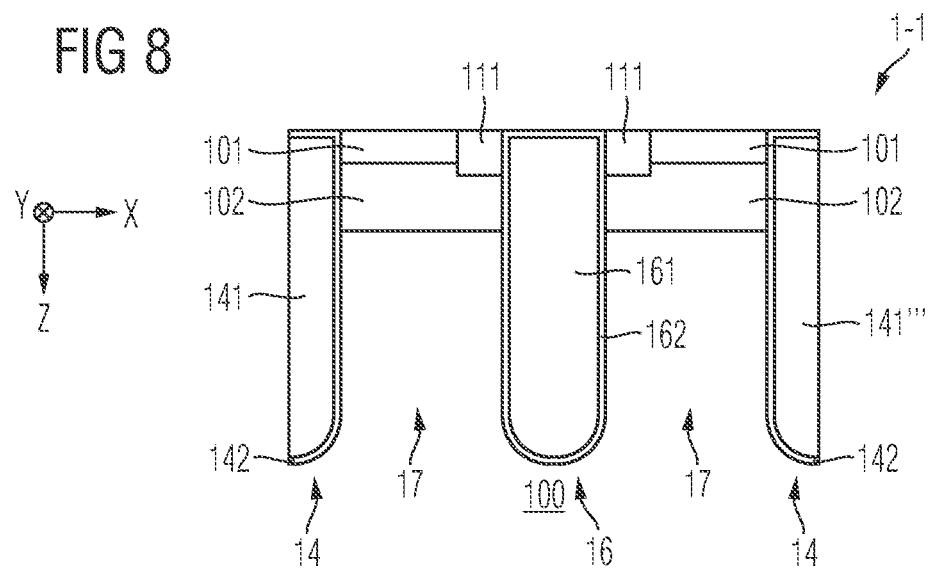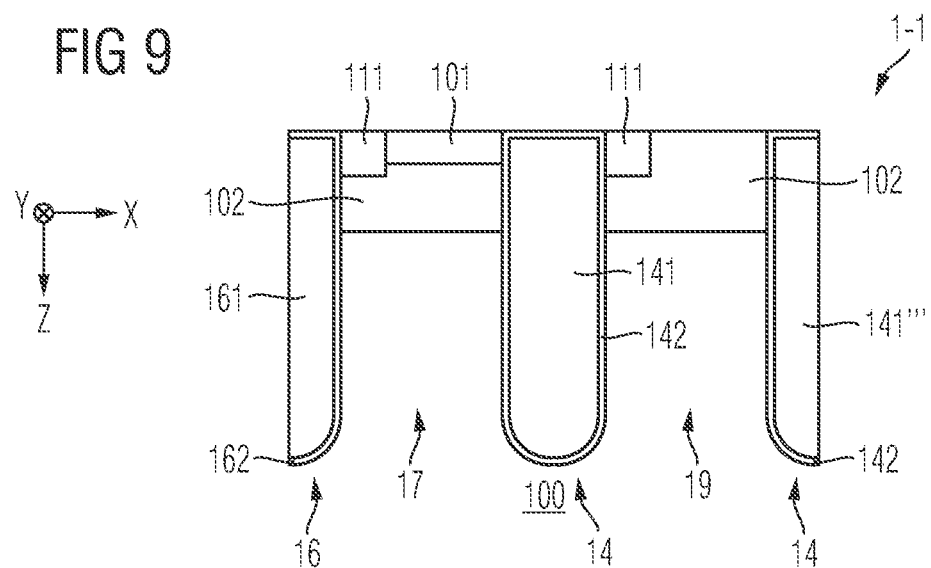

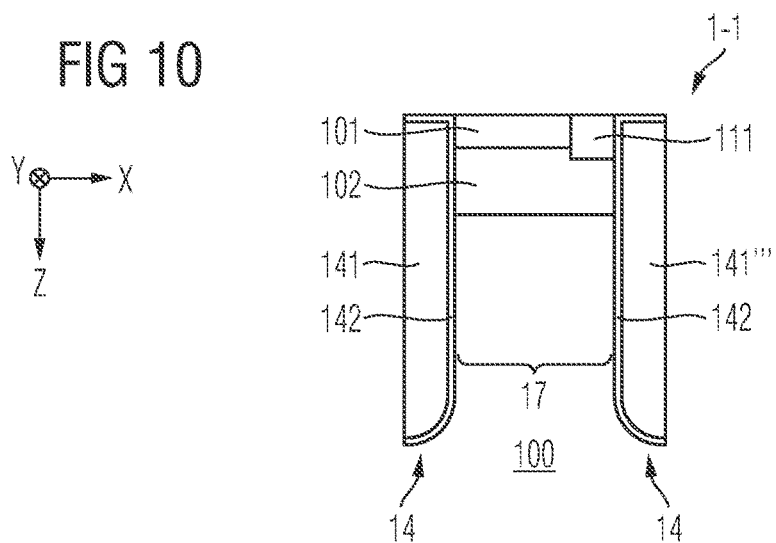
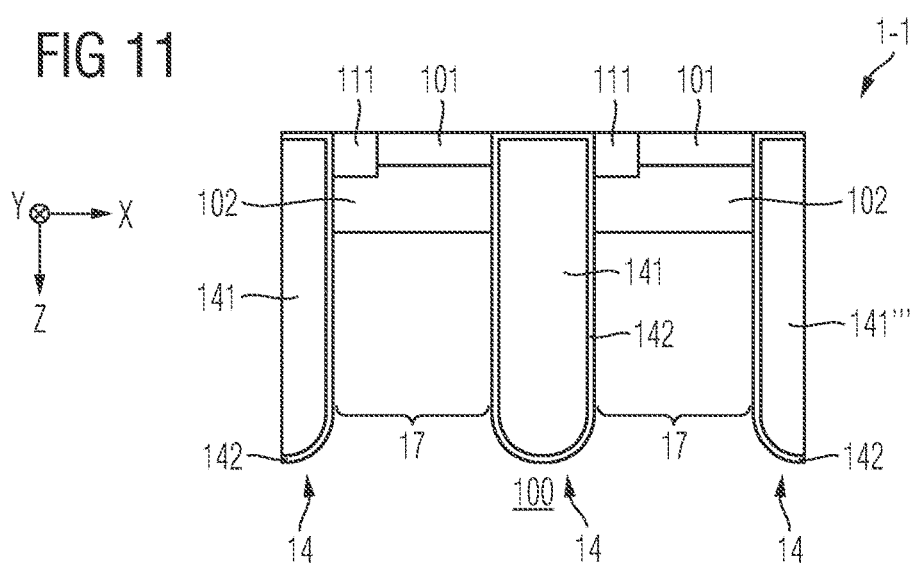
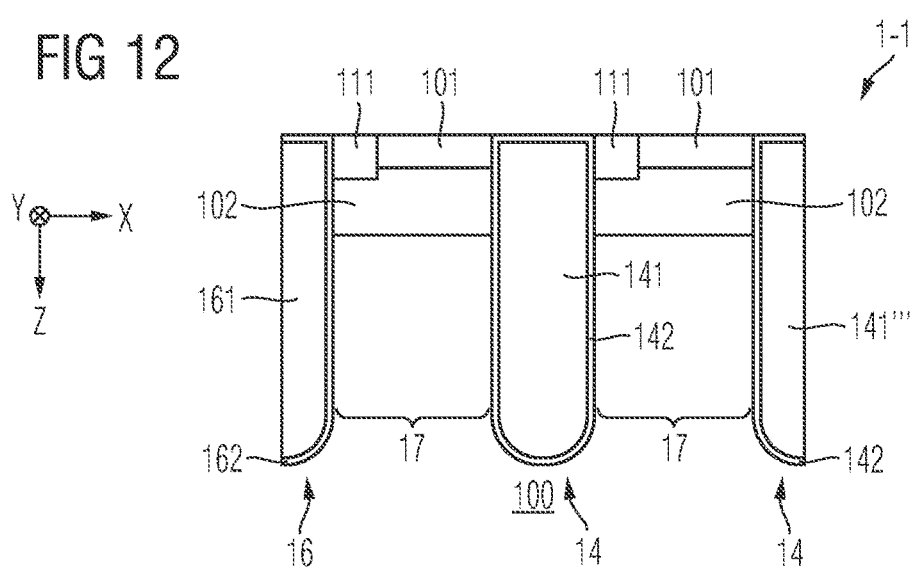

MESA CONTACT FOR MOS CONTROLLED POWER SEMICONDUCTOR DEVICE

TECHNICAL FIELD

This specification refers to embodiments of a power semiconductor device and to embodiments of a method of producing a power semiconductor device. In particular, this specification is related to embodiments where a contact plug contacts a narrow mesa of the power semiconductor device.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a forward conducting state and a blocking state.

Often, the gate electrode may be included within a trench of the power semiconductor switch, wherein the trench may exhibit a stripe configuration.

Two adjacent trenches laterally confine a portion of the semiconductor body typically referred to as mesa or mesa portion. Such mesa is typically configured for providing a path of the forward load current, e.g., by including a source region and a body region.

In order to provide for a path of the forward load current, the mesa must be electrically contacted with one of the load terminals of the power semiconductor device. Such a contact may, for example, be established by means of a contact plug structure, according to which an electrically conductive material extends into a groove-like recess in a central portion of the mesa so as to there contact both the source region and the body region.

For diverse reasons, it may be desirable to keep the width of such mesa, i.e., the distance between opposite trench sidewalls of the adjacent trenches laterally confining the mesa, small.

However, as the mesa width becomes smaller, it also becomes more difficult to reliably contact the same based on a contact plug structure.

SUMMARY

According to an embodiment, power semiconductor device comprises: a first load terminal at a first side, a second load terminal and, coupled to the first load terminal and the second load terminal, a semiconductor body configured for conducting a load current between the first load terminal and the second load terminal; a plurality of trenches at the first side and extending into the semiconductor body along a vertical direction. Each trench includes a trench electrode insulated from the semiconductor body by a trench insulator. Two of the plurality of trenches are arranged laterally adjacent to each other and spatially confine a mesa portion. A semiconductor source region is in the mesa portion. A semiconductor body region is in the mesa portion. A contact plug extends from the first side into the mesa portion. The contact plug is arranged: in contact with both the semiconductor source region and the semiconductor body region; in contact with the trench insulator of one of the two trenches that spatially confine the mesa portion; and spaced apart from the trench insulator of the other one of the two trenches that spatially confine the mesa portion.

According to an embodiment, power semiconductor device comprises: a first load terminal at a first side, a second load terminal and, coupled to the first load terminal and the second load terminal, a semiconductor body configured for conducting a load current between the first load terminal and the second load terminal; a plurality of trenches at the first side and extending into the semiconductor body along a vertical direction. Each trench includes a trench electrode insulated from the semiconductor body by a trench insulator. Two of the plurality of trenches are arranged laterally adjacent to each other and spatially confine a mesa portion. A contact plug extends from the first side into the mesa portion. The contact plug is arranged: in contact with at least one doped semiconductor region of the mesa portion; in contact with the trench insulator of one of the two trenches that spatially confine the mesa portion; and spaced apart from the trench insulator of the other one of the two trenches that spatially confine the mesa portion.

According to another embodiment, a method of producing a power semiconductor device comprises: forming a plurality of trenches at a first side and extending into a semiconductor body along a vertical direction, wherein each trench includes a trench electrode insulated from the semiconductor body by a trench insulator; two of the plurality of trenches are arranged laterally adjacent to each other and spatially confine a mesa portion; forming a semiconductor source region in the mesa portion; forming a semiconductor body region in the mesa portion; forming a contact plug extending from the first side into the mesa portion, wherein the contact plug is arranged in contact with both the semiconductor source region and the semiconductor body region; in contact with the trench insulator of one of the two trenches that spatially confine the mesa portion; and spaced apart from the trench insulator of the other one of the two trenches that spatially confine the mesa portion.

According to another embodiment, a method of producing a power semiconductor device comprises: forming a plurality of trenches at a first side and extending into a semiconductor body along a vertical direction, wherein each trench includes a trench electrode insulated from the semiconductor body by a trench insulator; two of the plurality of trenches are arranged laterally adjacent to each other and spatially confine a mesa portion; forming a doped semiconductor region in the mesa portion; forming a contact plug extending from the first side into the mesa portion, wherein the contact plug is arranged in contact with the doped semiconductor region; in contact with the trench insulator of one of the two trenches that spatially confine the mesa portion; and spaced apart from the trench insulator of the other one of the two trenches that spatially confine the mesa portion.

For example, it is proposed to spatially move the mesa contact as far away from an inversion channel in the mesa as necessary in order to maintain a stable threshold voltage of the vertical transistor (VGETH) on the one hand and in order to still provide a good contact to the body region in the mesa on the other hand if the mesa is very small in width. The contact groove for forming the contact plug can be placed laterally decentered and can be etched self-aligned towards the neighboring trench, yielding a contact groove (which may for example have a sub-lithographic width and/or exhibit a needle/columnar shape or a stripe shape) where a good contact resistance to the body region (e.g., a contact portion thereof) can then be facilitated, e.g., by an implant of the same type as the body region (e.g., a p-type implant in the case of a p-doped body region), for example a BF2 implant or the implementation of a Bor-Poly-Tip without impacting the inversion channel, in accordance with one or more embodiments.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings:

FIG. 3-12 each schematically and exemplarily illustrate a section of a vertical cross-section of a power semiconductor device in accordance with one or more embodiments;

DETAILED DESCRIPTION

Figure 1A:
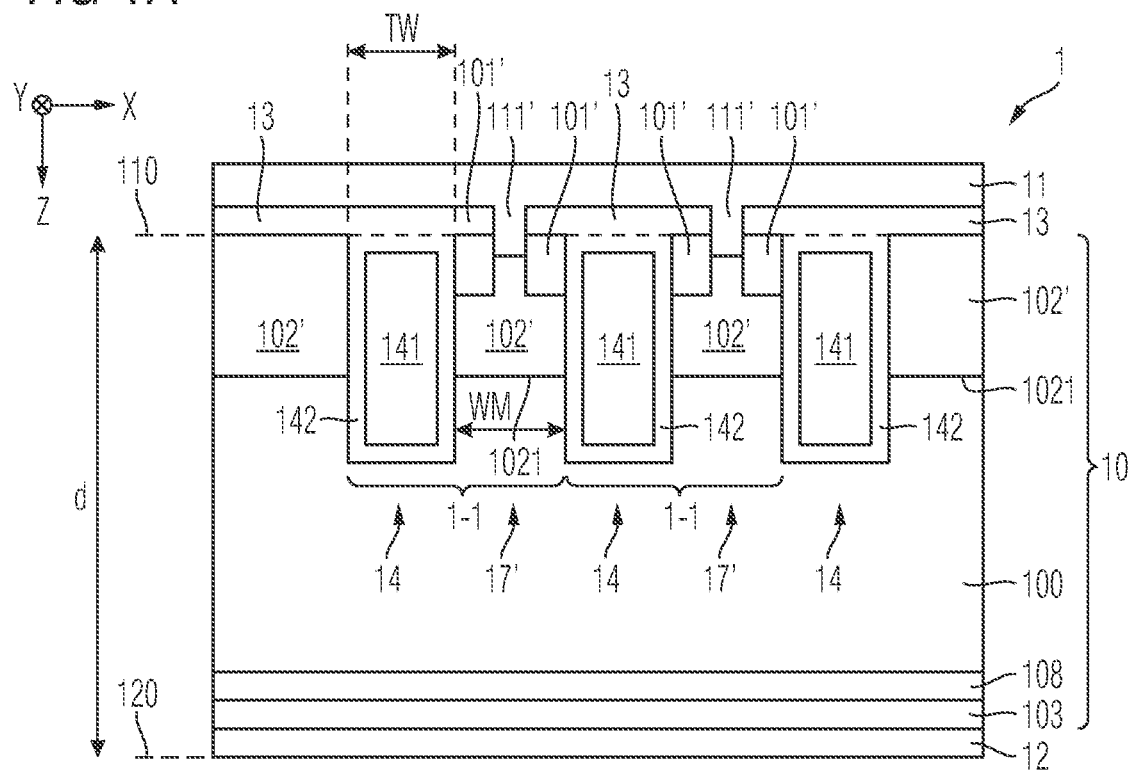
FIGS. 1A-B both schematically and exemplarily illustrate a section of a vertical cross-section of a power semiconductor device.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device, wherein "low ohmic" may mean that the characteristics of the respective contact are essentially not influenced by the ohmic resistance. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell configuration, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, a derivative of a monolithically integrated diode cell (e.g., a monolithically integrated cell of two anti-serially connected diodes), a monolithically integrated transistor cell, e.g., a monolithically integrated MOSFET or IGBT cell and/or derivatives thereof. Such diode/transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V or even more, e.g., up to at least 3 kV, or even up to 10 kV or more, depending on the respective application. For example, the term "power semiconductor device" as used in this specification is not directed to logic semiconductor devices that are used for, e.g., storing data, computing data and/or other types of semiconductor based data processing. The present specification in particular relates to power semiconductor devices embodied as respective MOSFETs or IGBTs, i.e., unipolar or bipolar power semiconductor transistors that are controlled by insulated electrodes (gates), or a derivate thereof.

For example, the power semiconductor device described below may be a single semiconductor chip exhibiting a stripe cell configuration (instead of a cellular/needle cell configuration) and can be configured to be employed as a power component in a low-, medium- and/or high voltage application. However, the herein proposed technical teaching may also be applied to a power semiconductor device having a cellular/needle cell configuration.

Figure 1B:
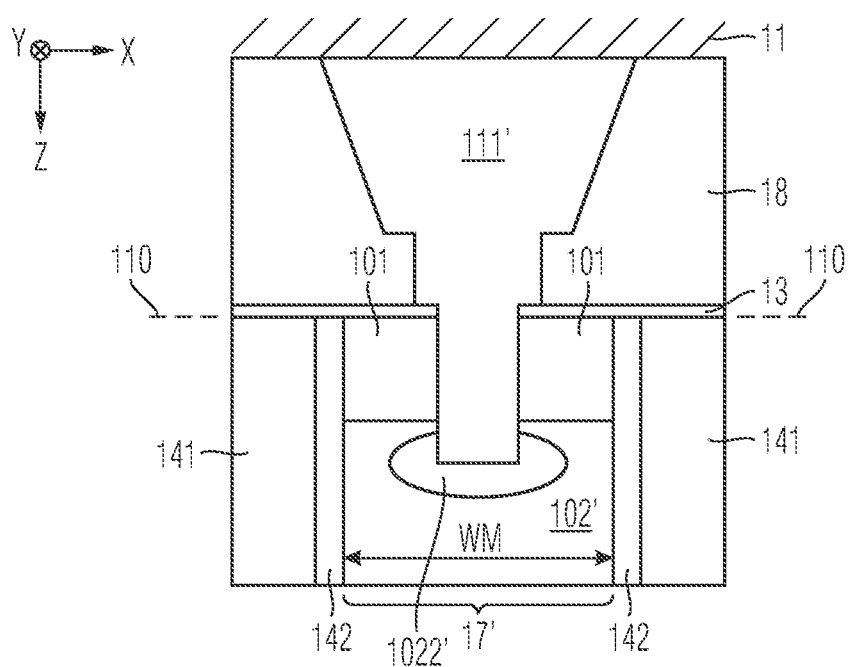

FIGS. 1A-B schematically and exemplarily illustrate a section of a vertical cross-section of a power semiconductor device 1. The power semiconductor device 1 can be based on/implemented within a single-chip.

Figure 2A:
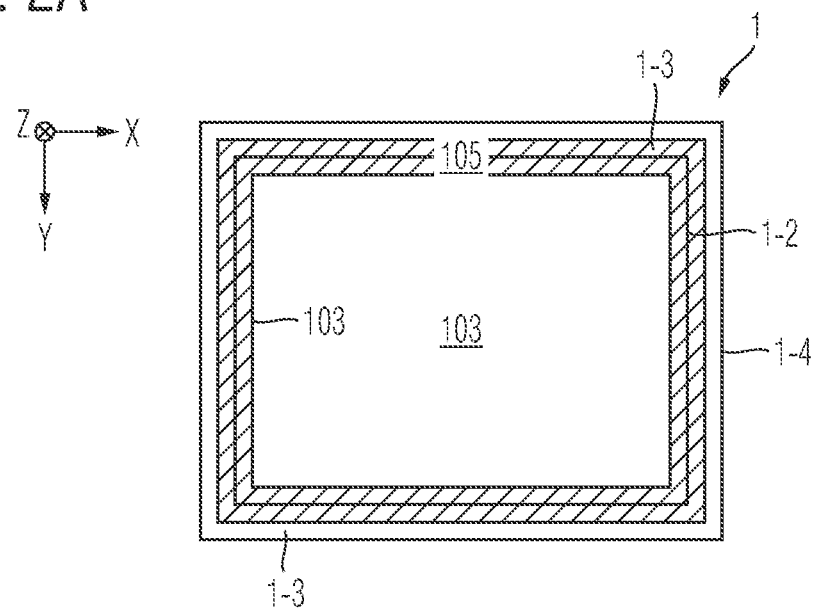
FIG. 2A-B both schematically and exemplarily illustrate a section of a horizontal projection of a power semiconductor device in accordance with one or more embodiments.
Figure 2B:
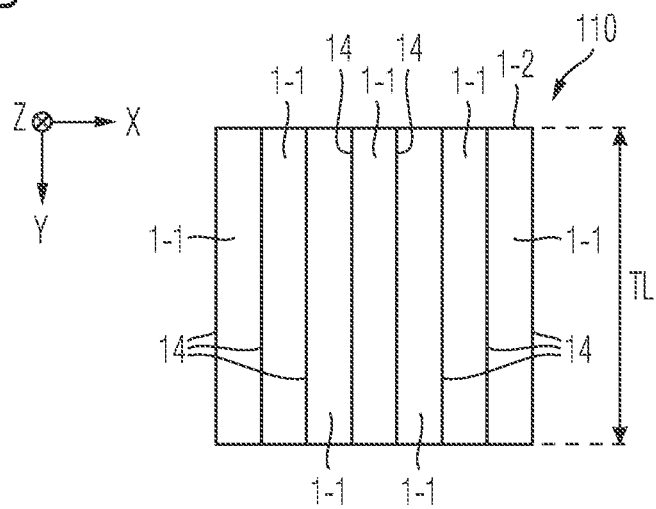

Referring to FIG. 2A, the power semiconductor device 1 can have an active region 1-2 with a number of power cells 1-1, which are arranged in accordance with a stripe cell configuration as exemplarily illustrated in FIG. 2B. Accordingly, an extension in the second lateral direction Y of each power cell 1-1 may amount to a multiple of the extension in the first lateral direction X. However, as indicated above, the herein proposed technical teaching may also be applied to a power semiconductor device having a cellular/needle cell configuration where the extension in the second lateral direction Y of each power cell would be in a similar range as the extension in the first lateral direction X.

An edge termination region 1-3 of the power semiconductor device 1 may surround the active region 1-2. Hence, the edge termination region 1-3 can be arranged external of the active region 1-2 and/or can adjoin the active region 1-2. The edge termination region 1-3 is laterally terminated by an edge 1-4. The edge 1-4 may form the chip edge of the power semiconductor device 1.

As used herein, the terms "edge termination region" and "active region" are both associated with the respective technical meaning the skilled person typically associates therewith in the context of power semiconductor devices. That is, the active region 1-2 is primarily configured for load current conduction and (if applicable) switching purposes, whereas the edge termination region 1-3 primarily fulfills functions regarding reliable blocking capabilities, appropriate guidance of the electric field, sometimes also charge carrier drainage functions, and/or further functions regarding protection and proper termination of the active region 1-2.

Referring to FIG. 1A again, the power semiconductor device 1 has a semiconductor body 10 having a frontside 110 (reference numeral 110 herein also being used for referring to a "first side" and a "semiconductor body surface") and a backside 120. The frontside 110 and the backside 120 may vertically terminate the semiconductor body 10. That is, the semiconductor body 10 can have a total thickness d along the vertical direction Z between the frontside 110 and the backside 120. In the lateral directions, the semiconductor body 10 may be terminated by the edge 1-4 (not illustrated in FIG. 1A). Furthermore, both the frontside 110 and the backside 120 may extend laterally along both the first lateral direction X and the second lateral direction Y. For example, both the frontside 110 and the backside 120 may form a respective horizontal surface of the semiconductor body 10. The thickness d of the semiconductor body 10 may be the distance between the frontside 110 and the backside 120 along the vertical direction Z in the active region 1-2, e.g., measured at a center of the active region 1-2.

The semiconductor body 10 forms a part of both the active region 1-2 and the edge termination region 1-3. E.g., the below described possible configurations of the power cell(s) 1-1 are primarily implemented in the semiconductor body 10. The semiconductor body 10 is, in the active region 1-2, configured to conduct a forward load current between a first load terminal 11 and a second load terminal 12.

For example, a first load terminal 11 is arranged at the semiconductor body frontside 110 and a second load terminal 12 is arranged at the semiconductor body backside 120. E.g., the first load terminal 11 comprises a frontside metallization and/or the second load terminal 12 comprises a backside metallization. For example, the first load terminal 11 is an emitter terminal and the second load terminal 12 is a collector terminal. At the frontside 110, the semiconductor body 10 may interface with the frontside metallization. At the backside 120, the semiconductor body 10 may interface with the backside metallization.

In an embodiment, the first load terminal 11 (e.g., said frontside metallization) laterally overlaps, that is, along the first lateral direction X and/or the second lateral direction Y and/or combinations thereof, with the active region 1-2. It shall be noted that the first load terminal 11 may be laterally structured, e.g., so as to establish local contacts with the semiconductor body 10 at the frontside 110. E.g., as exemplary illustrated in FIG. 1A, said local contacts can be established by means of a contact plug 111' penetrating a first insulation layer 13, e.g., according to which an electrically conductive material extends into a groove-like recess in a central portion of a mesa portion 17' so as to there contact both a source region 101' and a body region 102'.

Analogously, in an embodiment, the second load terminal 12 (e.g., said backside metallization) laterally overlaps, that is, along the first lateral direction X and/or the second lateral direction Y and/or combinations thereof, with the active region 1-2. It shall be noted that the second load terminal 12 is typically not structured but formed homogenously and monolithically at the semiconductor body backside 120, e.g., so as to establish a laterally homogenous contact with the semiconductor body 10 at the backside 120. Such homogenous structure may also be implemented in regions where the second load terminal 12 laterally overlaps with the edge termination region 1-3.

For example, the lateral boundary of the active region 1-2 is defined by the lateral boundary of the outermost power cell(s) 1-1. Hence, the lateral boundary of the active region 1-2 may be defined at the frontside 110. This lateral boundary can be defined by an outermost source region(s) 101' (cf. explanation in more detail below). For example, all functional elements to enable conduction of the load current are present in a vertical projection of the active region 1-2 of the power semiconductor device 1, e.g., including at least the first load terminal 11 (e.g., a frontside metal contact thereof, e.g., one or more of the contact plugs 111'), the source region(s) 101', a body region 102', a drift region 100, a backside emitter 103, and the second load terminal 12 (e.g., a backside metal thereof).

In an embodiment, the edge termination region 1-3 and the active region 1-2 may be symmetrically arranged to one another, e.g., with respect to a central vertical axis of the power semiconductor device 1, as it is exemplarily illustrated in FIG. 2A.

Furthermore, the lateral transition between the active region 1-2 and the edge termination region 1-3 may extend exclusively along the vertical direction Z, in accordance with an embodiment. As explained above, the lateral boundary of the active region 1-2 may be defined at the frontside 110, and a vertical projection along the vertical direction Z of such defined lateral boundary may hence be observed at the backside 120.

Returning to FIG. 1A, an exemplary configuration of one of the power cells 1-1 shall be described. Each power cell 1-1 of the power semiconductor device 1 may be equally configured. For example, each power cell 1-1 includes at least one trench 14 and at least one mesa portion 17'. In other embodiments, each power cell 1-1 may include more than one trench 14 and more than one mesa portion 17', wherein the trenches 14 may be identically or differently configured, and wherein the mesa portions 17' may be identically or differently configured.

A body region 102' of the second conductivity type is included in the semiconductor body 10. The body region 102' may be arranged in electrical contact with the first load terminal 11, e.g., by means of the contact plug 111'. In each power cell 1-1, there is furthermore provided at least one source region 101' of the first conductivity type arranged in electrical contact with the first load terminal 11, e.g., also by means of the contact plug 111'.

A major part of the semiconductor body 10 is formed as a drift region 100 of the first conductivity type, which interfaces with the body region 102' and forms a pn-junction 1021 therewith.

The body region 102' is arranged between the source regions 101' and the drift region 100 and may isolate the source regions 101' from the drift region 100.

Each power cell 1-1 is furthermore associated with a trench electrode 141. The trench electrodes 141 may be arranged in a respective trench 14 and can be isolated from the semiconductor body 10 by means of a respective trench insulator 142. Upon receipt of a corresponding control signal, e.g., provided by a non-illustrated gate driver unit, each trench electrode 141 can induce an inversion channel in a section of the body region 102' adjacent to the respective trench electrode 141. Thus, each of the number of power cells 1-1 is configured for conducting at least a portion of the load current between the first load terminal 11 and the second load terminal 12.

In the above described basic configuration of the power cells 1-1 of a power semiconductor device (e.g., a MOSFET, an IGBT or RC-IGBT), the used terminology (e.g., the term "power cells") is within the scope of the technical meaning the skilled person typically associates therewith.

Furthermore, in addition to the configuration as control electrodes, other trench electrodes 141 could be provided in some or each of the power cells 1-1 that fulfill another function, such as dummy trench electrodes, source trench electrodes, floating trench electrodes and the like.

As illustrated in FIG. 1A, the body region 102' extends from the frontside 110 along the vertical direction Z until it interfaces with the drift region 100. The drift region 100, which may laterally overlap with the entire lateral area occupied by the number of power cells 1-1, extends for a longer range along the vertical direction Z, until it interfaces with a field stop layer 108 (also known as buffer layer), wherein the field stop layer 108 is also of the first conductivity type, but exhibits a higher dopant dose as compared to the drift region 100. The field stop layer 108 is typically of significantly smaller thickness than the drift region 100. It also extends along the vertical direction Z until interfacing with the backside emitter region 103. The backside emitter region 103 is arranged in electrical contact with the second load terminal 12, as illustrated in FIG. 1A.

In case of an IGBT, the backside emitter region 103 acts as an emitter of the second conductivity type. Furthermore, if the power semiconductor device 1 is implemented as an RC-IGBT, the backside emitter region 103 may comprise some sections of the first conductivity type, which exhibit a rather high dopant concentration (e.g., higher as compared to the dopant concentration of the drift region 100), e.g., in the range of $10^{16}$ cm$^{-3}$ to $10^{20}$ cm$^{-3}$. In case of a MOSFET, the backside emitter region 103 acts as an emitter of the first conductivity type.

With respect to the lateral extension of the backside emitter 103, in an embodiment, the emitter region 103 may laterally overlap with at least 80%, or at least 90% of a lateral area occupied by the number of power cells 1-1 in the active region 1-2. In an embodiment, the emitter region 103 may, as the drift region 100, laterally overlap with the entire (100% of the) lateral area occupied by the number of power cells 1-1 in the active region 1-2. In other embodiments, as illustrated in FIG. 2A, the emitter region 103 laterally overlaps with less than 100% of the lateral area occupied by the number of power cells 1-1 in the active region 1-2, e.g., with around 80% to 90%.

An outermost portion of the active region 1-2 at the backside 120 arranged, in such case, laterally "between" (cf. explanation below) the edge termination region 1-3 and the backside emitter region 103 (herein also referred to as "emitter region 103" or "backside emitter 103") may be occupied by a termination frame region 105 formed in the semiconductor body 10 at the backside 120.

The termination frame region 105 can be of the second conductivity type (e.g., p-type) and may be arranged in electrical contact with the second load terminal 12. The termination frame region 105 is not illustrated in FIG. 1A, but it may have a thickness along the vertical direction Z approximately as great as the thickness of the backside emitter 103. The termination frame region 105 may not only extend into the active region 1-2, but also into the edge termination region 1-3. The edge termination region 1-3 can extend to the chip edge 1-4. As explained above, depending on the lateral extension of the backside emitter 103, the termination frame region 105 may, at the backside 120, extend into either the active region 1-2 or the edge termination region 1-3, or into both the active region 1-2 and the edge termination region 1-3. However, in an embodiment, the percentage of the lateral area of the active region 1-2 at the backside 120 occupied by the termination frame region 105 amounts to at most 20%, or to at most 10%, in accordance with an embodiment.

Furthermore, the termination frame region 105 can exhibit a VLD (variation of the lateral doping) profile with a decreasing dopant concentration in the direction to the edge termination region 1-3 and/or a VLD profile with an increasing dopant concentration in the direction to the emitter region 103.

The termination frame region 105 is occasionally also referred to as HDR (High Dynamic Robustness) region and may be designed as an interface region between the backside emitter 103 and the semiconductor body portion in the edge termination region 1-3, e.g., so as to able to contribute to appropriate electrical field strengths in the semiconductor body 10 that are beneficial with regards to the robustness of the power semiconductor device 1.

It is emphasized that the power semiconductor device 1 may also be embodied as a MOSFET, with corresponding implications regarding the configuration of the semiconductor regions 103 and 108, or as a device deviated from a MOSFET configuration or an IGBT configuration.

The above described aspects of the power semiconductor device 1 relate to the basic configuration of the power semiconductor device 1. Embodiments described herein are related to a novel design regarding the contact between the first load terminal 11 and the mesa portions 17', as well as the mesa configuration in terms of the source region 101' and the body region 102'. As in particular these aspects may be modified in accordance with the embodiments disclosed herein, in the subsequent description, the body region will be referred to with reference numeral 102, the source region with reference numeral 101, the mesa portion with reference numeral 17 and the contact plug with reference numeral 111, whereas the other reference numerals introduced above do not designate components that necessarily differ from those introduced with respect to FIGS. 1A-2B and are accordingly used in the same manner below.

For diverse reasons, it may be desirable to keep the width WM of the mesa portion, i.e., the distance between opposite trench sidewalls of the adjacent trenches 14 laterally confining the mesa portion, small. However, as the mesa width WM becomes smaller, it also becomes more difficult to reliably contact the mesa portion 17 (e.g., the source region 101 and/or the body region 102) with a contact plug 111' in a manner as illustrated in FIGS. 1A-B. E.g., referring to FIG. 1B, the contact plug 111' extends through an insulation structure 13,18 into a central section of the mesa portion 17' so as to contact both the source region 101' and a contact portion 1022' of the body region 102' in the mesa portion 17'. An inversion channel is induced in a portion of the body region 102 interfacing the trench insulators 142 below the source region 101. For this reason, it is typically desired that the contact portion 1022' of the body region 102' is laterally displaced from the trench insulator 142 of the trench 14 which includes the trench electrode 141 that induces said inversion channel. As the mesa width WM becomes smaller, this design goal may be difficult to achieve.

Each of FIG. 3-12 schematically and exemplarily illustrates a section of a vertical cross-section of the power semiconductor device 1 in accordance with one or more embodiments.

The power semiconductor device 1 illustrated in FIGS. 3-12 may comprise: the first load terminal 11 at the first side 110 (which is a frontside formed by the semiconductor body surface), the second load terminal 12 and, coupled to the first load terminal 11 and the second load terminal 12, the semiconductor body 10 configured for conducting the load current between the first load terminal 11 and the second load terminal 12; the plurality of trenches 14 at the first side 110 and extending into the semiconductor body 10 along the vertical direction Z. Each trench 14 includes its trench electrode 141 insulated from the semiconductor body 10 by its trench insulator 142. Two of the plurality of trenches 14 are arranged laterally adjacent to each other and spatially confine a mesa portion 17. The mesa portion may comprise a semiconductor source region 101 and a semiconductor body region 102. A contact plug 111 extends from the first side 110 into the mesa portion 17. The contact plug 111 may be arranged in contact with both the semiconductor source region 101 and the semiconductor body region 102. Further, the contact plug 111 may be in contact with the trench insulator 142 of one of the two trenches 14 that spatially confine the mesa portion 17. The contact plug 111 may be arranged spaced apart from the trench insulator 142 of the other one of the two trenches 14 that spatially confine the mesa portion 17.

The trenches 14 may exhibit a stripe configuration, according to which each trench 14 has a trench width TW (cf. FIG. 1A) along a first lateral direction X and a trench length TL (cf. FIG. 2B) along the second lateral direction Y perpendicular to the first lateral direction X, the trench length TL amounting to at least five times the trench width TW. The mesa portion 17 may have a design corresponding to the configuration of the trenches 14 that laterally confine the mesa portion 17. For example, the trenches 14 may continuously extend throughout the entire active region 1-2 (cf. FIG. 2A-B) along the second lateral direction Y.

Figure 3:
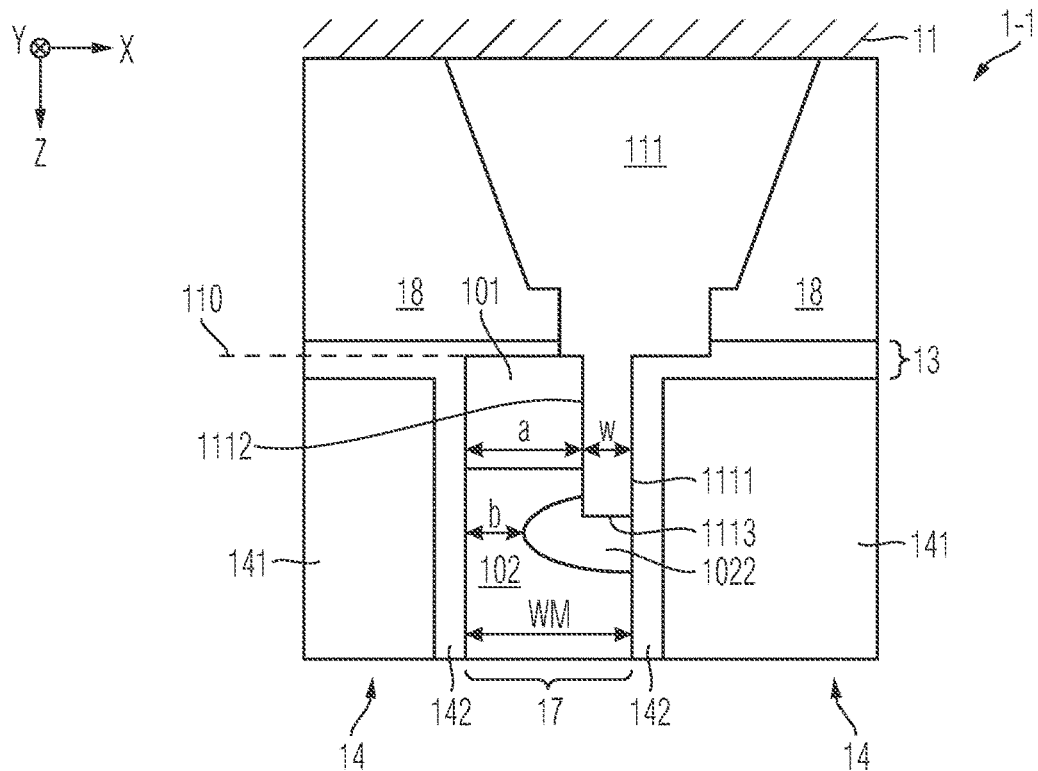

Hence, in accordance with the embodiments of FIGS. 3-12, the contact plug 111 may be arranged asymmetrically with respect to the extension of the mesa portion 17 along the first lateral direction X, i.e., laterally decentered. The entire mesa portion 17 may exhibit an asymmetrical design with respect to the first lateral direction X. E.g., as illustrated in FIG. 3, the source region 101 may occupy the section of the mesa portion 17 between the contact plug 111 and the trench insulator 142 of the other one of the two trenches 14 (which is not in contact with the contact plug 111). Furthermore, a contact portion 1022 of the body region 102 may be formed in a region of the mesa portion 17 below the contact plug 111, e.g. in a region of the mesa portion 17 corresponding to a vertical projection of the bottom of the contact plug 111. The contact portion 1022 of the body region 102 may be spatially displaced from the trench insulator 142 of the other one of the two trenches 14 (which is not in contact with the contact plug 111). Variants and optional aspects of such design will now be described:

In an embodiment, the contact plug 111 is electrically isolated from the trench electrode 141 by means of the trench insulator 142 of one of the two trenches 14 that spatially confine the mesa portion 17. That is: In such embodiment, as illustrated in FIGS. 3-12, the contact plug is not in contact or electrically connected to the trench electrode 141 of the trench 142 to whose trench insulator 142 it is in contact with. For example, the trench insulator 142 and the first insulation layer 13 isolate the contact plug 111 form the trench electrode 141. With respect to all embodiments described herein, the contact plug 111 may be electrically isolated from each trench electrode 141, at least by means of the corresponding trench insulator 142 of corresponding the trench 14.

Figure 4:
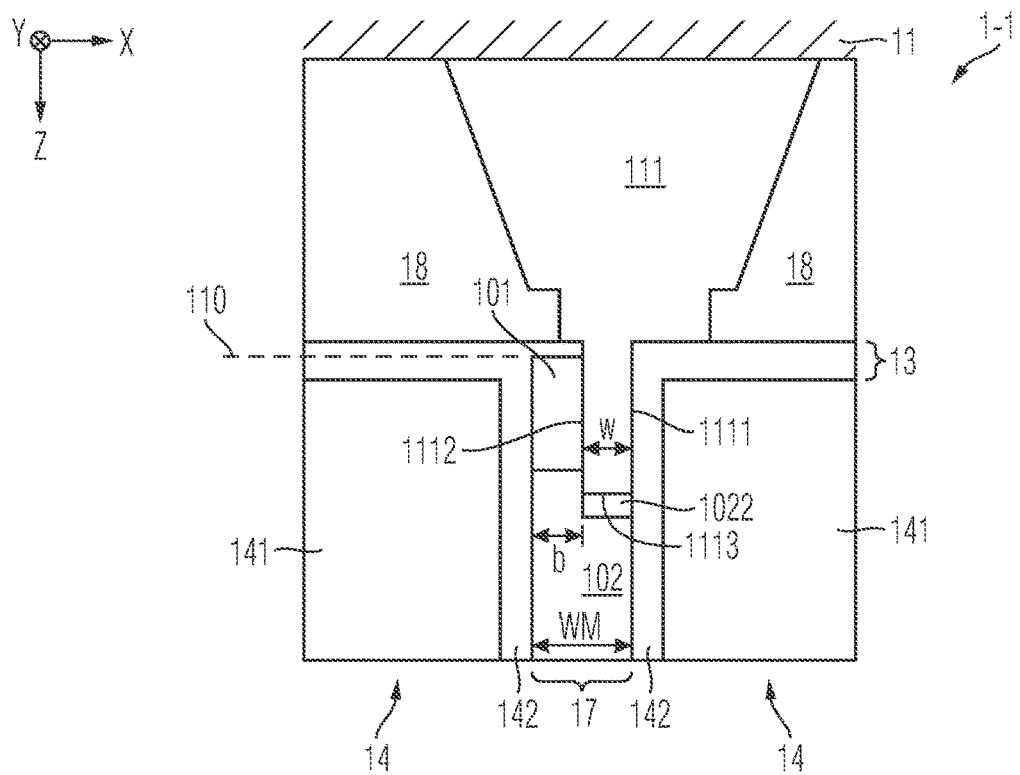

For example, the contact between the contact plug 111 and each of the semiconductor source region 101, the semiconductor body region 102 and the trench insulator 142 is established within the mesa portion 17, as illustrated in FIGS. 3 and 4.

Furthermore, in a region above the mesa portion 17, the contact plug 111 may laterally overlap with the trench electrode 141 of the trench 14 whose trench insulator 142 is contacted by the contact plug 111 in the mesa portion 17. That is: When penetrating through the insulation structure 18, 13 along the vertical direction Z, the contact plug 111 may decrease in width along the first lateral direction X.

For example, the contact plug 111 may include a first lateral surface 1111, a second lateral surface 1112 and a bottom surface 1113. The first lateral surface 1111 may interface with the trench insulator 142. The bottom surface 1113 may interface with the semiconductor body region 102. The second lateral surface 1112 may interface with the semiconductor source region 101. Further, the second lateral surface 1112 may interface with the semiconductor body region 102, for example with the contact portion 1022 of the semiconductor body region 102 and/or with the remaining part of the semiconductor body region 102 that is not formed by the contact portion 1022. These surfaces are only provided with reference signs in FIGS. 3 and 4, but are likewise present in the embodiments of FIGS. 5-12. A lateral distance a in the first lateral direction X between the second lateral surface 1112 and the trench insulator 142 of the other trench 14 amounts to at least 200 nm, in accordance with an embodiment.

For example, the width WM of the mesa portion 17 in the first lateral direction X amounts to less than 600 nm, 300 nm or even less than 200 nm. The width w of the contact plug 111 within the mesa portion 17 may amount to, e.g., 100 nm or less than 100 nm.

The semiconductor body region 102 may include a contact portion 1022 with a locally increased dopant concentration, wherein the contact plug 111 contacts said contact portion 1022, e.g., with its bottom surface 1113. Furthermore, as illustrated in FIGS. 3 and 4, the contact portion 1022 can be in contact with the trench insulator 142 that is also contacted by the contact plug 111. The contact portion 1022 is, in accordance with one or more embodiments, spaced apart from the trench insulator 142 of the other trench 14 by a distance b in the first lateral direction X amounting to at least 200 nm and/or to at least 20% the width WM of the mesa portion 17 in the first lateral direction X. For example, it is therewith avoided that the contact portion 1022 of the body region 102 extends into the section of the mesa portion 17 where the inversion channel is induced.

At this point, it shall be noted that inducing the inversion channel, i.e., "turning-on" and "turning-off" a conduction channel in the mesa portion 17, may be controlled via subjecting the trench electrode 141 with a defined electrical potential, e.g., by applying a voltage between the first load terminal 11 and the (non-illustrated) control terminal of the power semiconductor device 1. In an embodiment, a threshold voltage at which the conduction channel is turned-on, i.e., at which the inversion channel is induced, depends, inter alia, on the dopant concentration of the contact portion 1022. In an embodiment, the distance b by which the contact portion 1022 may be spaced apart from the trench insulator 142 of the other trench 14 in the first lateral direction X is chosen such that an increase (e.g., compared to a situation where b=0) of the dopant dose in the contact portion 1022 may be lower than 6%, or lower than 4% or lower than 2% (e.g., lower than $0.04*10^{13}$ cm$^{-2}$) or, respectively, an increase (e.g., compared to a situation where b=0) of the threshold voltage is lower than 4%, or lower than 2% or lower than 1%, (e.g. lower than 100 mV), such that said displacement by the distance b maintains efficient functionality of the power semiconductor device 1.

For example, each of the contacts formed between the contact plug 111 and the source region 101, between the contact plug 111 and the contact portion 1022 and between the contact plug 111 and the trench insulator 142 may be a physical contact.

In accordance with embodiments described herein, the contact plug 111 is neither in contact with one or more of the trench electrodes 141, nor electrically connected thereto. E.g., the contact plug 111 is not a so-called "shared contact plug" used for contacting both a mesa and an adjacent electrode.

The contact portion 1022 of the body region 102 may be formed in different manners, resulting in different spatial dimensions of said portion, as illustrated schematically in FIGS. 3 and 4. This aspect will be described in greater detail below. In any case, the contact portion 1022 of the body region 102 may extend further along the vertical direction Z as compared to the source region 101. For example, the contact portion 1022 of the body region 102 is vertically displaced from the source region 101, e.g., by at least 50 nm along the vertical direction Z (cf. FIG. 3). In another embodiment, there is no such displacement (cf. FIG. 4). However, in both variants, it may be provided that the contact portion 1022 of the body region 102 may extend further along the vertical direction Z as compared to the source region 101; in other words, it may be provided that the contact portion 1022 of the body region 102 is at least partially arranged below, in terms of the vertical direction Z, the source region 101.

In accordance with the asymmetrical design of the mesa portion 17, the first lateral surface 1111 may contact the trench insulator 142 of one of the two trenches 14, e.g., for a vertical extension of at least 100 nm or at least 300 nm. The second lateral surface 1112 may contact the source region 101, e.g., for a vertical extension of at least 50 nm or at least 200 nm. Said lateral surfaces 1111, 1112 may be arranged in parallel to each other and/or be arranged at the same vertical level.

For example, the section of the mesa portion 17 between the second lateral surface 1112 and the trench insulator 142 of the other trench 14 is entirely occupied by the source region 101 and a portion of the body region 102 and, optionally (cf. FIG. 3) a portion of the contact portion 1022 of the body region 102. The section of the mesa portion 17 between the second lateral surface 1112 and the trench insulator 142 of the other trench 14 may be entirely occupied by the source region 101 and a portion of the body region 102, only (cf. FIG. 4).

The above described asymmetrical design of the mesa portion 17 may be implemented in diverse configurations of the power cell 1-1, which may include, as indicated above, more than one mesa portion 17 and/or more than two associated trenches 14, wherein the mesa portions 17 and/or the trenches 14 may differ in configuration from each other.

For example, both trenches 14 that laterally confine the mesa portion 17 are control trenches 14 and their trench electrodes 141 are control electrodes 141 insulated from the first load terminal 11 and configured to control the load current in the mesa portion 17. Such a configuration is, for example, schematically illustrated in FIGS. 3, 4 and 5. A variation thereof is illustrated in FIG. 10, according to which the control electrodes 141, 141''' are connected to different electrical potentials G1, G2 at least during a control operation. For example, such configuration may be achieved by connecting one of the control electrodes 141 to a control terminal (not illustrated) via a first connection having a first ohmic resistance, and by connecting the other one of the control electrodes 141''' to a control terminal (not illustrated) via a second connection having a second ohmic resistance smaller or greater than the first ohmic resistance. Combinations of such concepts are also possible, as illustrated in FIG. 11, where each power cell 1-1 comprises two mesa portions 17 and three associated trenches 14.

Furthermore, each power cell 1-1 may include a source trench 16 having a trench electrode 161 which is a source electrode 161 electrically connected to the first load terminal 11 (cf. FIGS. 6-9 and 12). Alternatively or additionally, at least one of two trenches laterally confining the mesa portion 17 may be a multi-trench-electrode trench, cf. FIG. 6.

For example, in accordance with FIG. 6, both trenches 14', 14" that laterally confine the mesa portion 17 are dual electrode trenches with a respective upper trench electrode 1411 connected to the control terminal (G) and a respective lower trench electrode 1412, 1612. The lower trench electrode 1412 of trench 14' may also be electrically connected to the control terminal or be electrically floating, whereas the lower trench electrode 1612 of trench 14" may be electrically connected to the first load terminal 11 (S), i.e., may be a source electrode. In trench 14', the two electrodes 1411 and 1412 are separated from each other along the vertical direction Z at least by the horizontal trench insulator 142', and in trench 14", the two electrodes 1411 and 1612 are separated from each other along the vertical direction Z at least by the horizontal trench insulator 142".

In accordance with the embodiment illustrated in FIG. 7, each power cell 1-1 may include a second type mesa portion 18, e.g., laterally confined by a control trench 14 on the one side and a source trench 16 on the other side. For example, the second type mesa portion 18 is not electrically connected to the first load terminal 11 based on a contact plug 111; rather, the section of the semiconductor body surface 110 formed by the second type mesa portion 18 is entirely covered by the first insulation layer 13, in accordance with an embodiment. The other mesa portion 17 of the power cell 1-1 of FIG. 7 may be designed as the one of FIG. 5 (with the contact plug 111 being arranged in contact with the left one of the two control trenches 14 instead of the right one). However, it may also be possible that the contact plug 111 is arranged in contact with the right one of the two control trenches 14 in combination with a second type mesa portion 18 as described above.

Diverse configurations of the power cells 1-1 are possible.

A further variant is illustrated in FIG. 8, where two mesa portions 17 are provided for each power cell 1-1, one of which being laterally confined by the control trench 14 and the source trench 16, the other one being laterally confined by the source trench 14 and another control trench 14''' whose control electrode 141''' is electrically connected to a different electrical potential (G2) as compared to the control electrode 141 of trench 14 (G), at least during a control operation, such as a switching operation. The contact plugs 111 employed for contacting the two mesa portions 17 may be arranged laterally adjacent to the trench insulator 162 of the source trench 16. A slight variation is illustrated in FIG. 9, where one of the two mesa portions 17 is replace with a third type mesa portion 19. The third type mesa portion 19 is configured as the mesa portion 17, and also contacted in the same way based on the contact plug 111; however, the third type mesa portion 19 is not equipped with a source region 101. For example, the third type mesa portion 19 may hence act as a diode mesa portion.

The variant of FIG. 10 has already been described; it corresponds to the variant of FIGS. 3-5, except in that one of the control electrodes 141''' is, at least during a control operation, connected to a different electrical potential (G2) as compared to control electrode 141 (G1). Such configuration of the power cell 1-1 may, for example, be combined with the configuration in accordance with FIGS. 3-5, yielding a configuration of the power cell 1-1 as illustrated in FIG. 11; there, two mesa portions 17 may be controlled differently based on the at least temporarily different electrical potentials G1, G2 of the control electrodes 141, 141'''.

The configuration of the power cell 1-1 of FIG. 10 may also be combined with the configuration in accordance with FIG. 6, yielding a configuration of the power cell 1-1 as illustrated in FIG. 12. There, two mesa portions 17 may be controlled differently based on the at least temporarily different electrical potentials G1, G2 of the different control electrodes 141, 141''' and based on the electrical potential of the first load terminal 11 (S). E.g., the left one of the mesa portions 17 is controlled based on electrical potential G1 of control electrode 141, and the right one of the mesa portions 17 is controlled based on electrical potential G2 of control electrode 141'''.

Everything else what has been described with respect to FIGS. 1-4 may analogously apply to the embodiments of FIGS. 5-12, if not stated otherwise.

Figure 13:
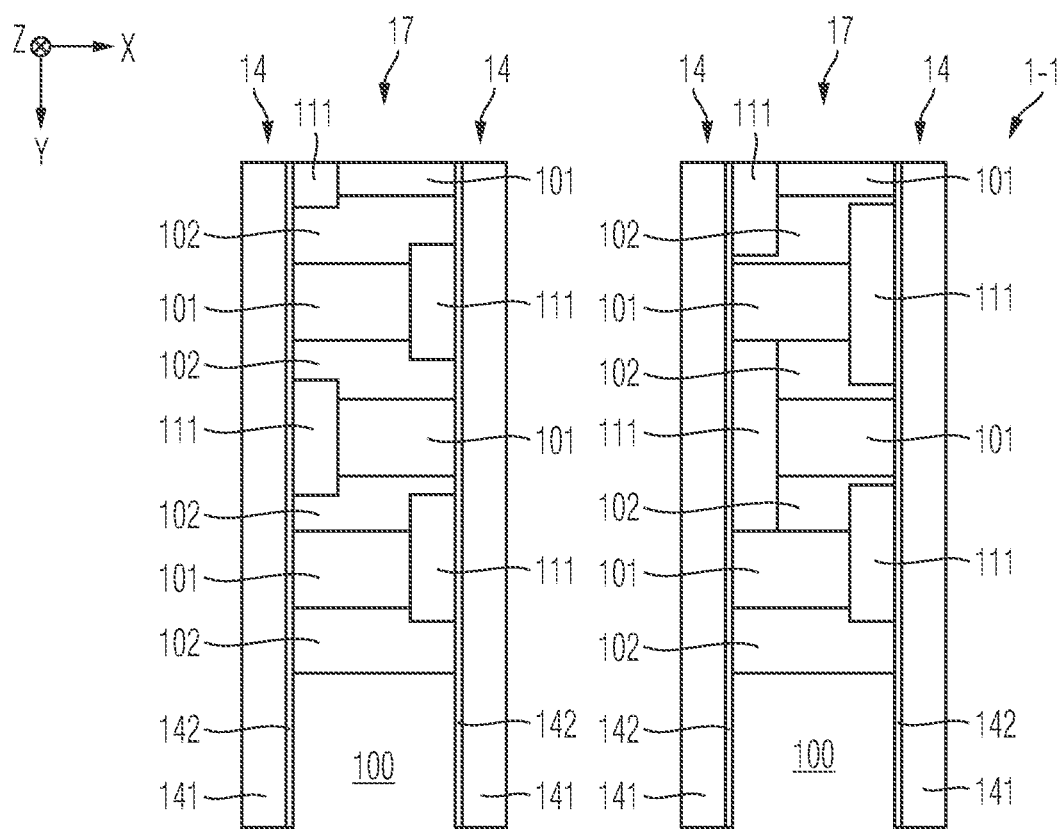
FIG. 13 schematically and exemplarily illustrates a section of a horizontal projection of a power semiconductor device in accordance with one or more embodiments.

Now referring to FIG. 13, in accordance with an embodiment, the source region 101 may be laterally structured within the mesa portion 17. Furthermore, the positions and the shapes of the contact plugs 111 used for contacting the source regions 101 within the mesa portions 17 may be chosen accordingly. E.g., along the second lateral direction Y, the source regions 101 spatially separated from each other and are provided in an alternating manner with respect to the trench insulators 142 they establish contact with. The contact plugs 111 are accordingly positioned. The source region 101, may, however, also be implemented contiguously and only adjacent to one of the trenches, and the contact plug 111 may exhibit a corresponding groove-like design that contiguously extends along the second lateral direction Y, yielding a stripe configuration of the shape of the contact plug 111.

Accordingly, the extension of the contact plug 111 in the second lateral direction Y may vary depending on the chosen trench-mesa-design of the power semiconductor device 1. For example, the extension of the contact plug 111 in the first lateral direction X and the position of the contact plug 111 with respect to the first lateral direction X are bound to the exemplary design constraints mentioned above, e.g., in that the second lateral surface 1112 is displaced from the trench insulator 142 of the opposite trench 14. In an embodiment, the extension of the contact plug 111 in the second lateral direction Y is substantially equal to the extension of the mesa portion 17 in the second lateral direction Y, e.g., yielding a stripe configuration of the shape of the contact plug 111. In another embodiment, the contact plug 111 exhibits a shape according to which its extension in the first lateral direction X and in the second lateral direction Y are in the substantially same range, yielding a needle/columnar configuration. In yet another embodiment, the contact plug 111 exhibits a shape according to which its extension in the first lateral direction X is about one half or one third of the extension in the second lateral direction Y, as schematically illustrated in FIG. 13.

Furthermore, as also illustrated in FIG. 13, the same mesa portion 17 may be equipped with contact plugs 111 at both lateral sides of the mesa portion 17. For example, this may allow to induce a respective inversion channel (conduction channel) along both adjacent trenches 14 that laterally confine the mesa portion 17, wherein said inversion channels may be electrically connected to the first load terminal 11 via the respective source region 101. A configuration with contact plugs 111 at both lateral sides of the mesa portion 17 may be used in combination with a so-called dual-gate device, where the trench electrodes 141 of the two adjacent trenches 14 confining the mesa portion 17 are electrically connected to different gate (control) potentials.

Furthermore, the contact plugs 111 may be arranged such there is an overlap along the second lateral direction Y (cf. FIG. 13, mesa portion 17 at the right) or such that no overlap along the second lateral direction Y is formed (cf. FIG. 13, mesa portion 17 at the left). In more general terms, the contact plug(s) 111 in the mesa portion 17 may be arranged and dimensioned in accordance with the lateral structure of the source region(s) 101 in said mesa portion 17. Thus, the herein proposed novel design of the contact plug 111 may be applied to various designs of the mesa portion 17 and to various designs of the trenches 14 and to various designs of the trench pattern (source trenches, dummy trenches, floating trenches etc.). Hence, the herein proposed novel design of the contact plug 111 may be used to implement various contacting schemes.

Presented herein is also a method of producing a power semiconductor device. The method of producing a power semiconductor device comprises: forming a plurality of trenches at a first side and extending into a semiconductor body along a vertical direction, wherein each trench includes a trench electrode insulated from the semiconductor body by a trench insulator; two of the plurality of trenches are arranged laterally adjacent to each other and spatially confine a mesa portion; forming a semiconductor source region in the mesa portion; forming a semiconductor body region in the mesa portion; forming a contact plug extending from the first side into the mesa portion, wherein the contact plug is arranged in contact with both the semiconductor source region and the semiconductor body region; in contact with the trench insulator of one of the two trenches that spatially confine the mesa portion; and spaced apart from the trench insulator of the other one of the two trenches that spatially confine the mesa portion.

Exemplary embodiments of the method correspond to the embodiments of the power semiconductor device 1 disclosed above. In so far, it is referred to the previous description. A further exemplary embodiment of the method is illustrated in FIG. 14, to which it will now be referred:

In step 201 of method 200, an electrically conductive material 145, for example, a polycrystalline semiconductor, may be deposited into the trenches 14 such that it covers the trench insulators 142 and the first side 110 (i.e., the semiconductor body surface). That is, in step 201, the trench electrodes 141 may be formed. Here, it should be noted that the trench insulator 142 is illustrated as also covering the mesa portions 17, wherein it is also possible to provide an insulation at the mesa portions 17 at a later processing stage, e.g., based on a sacrificial insulator layer or the like (cf. first insulation layer 13 mentioned further below).

Figure 14:
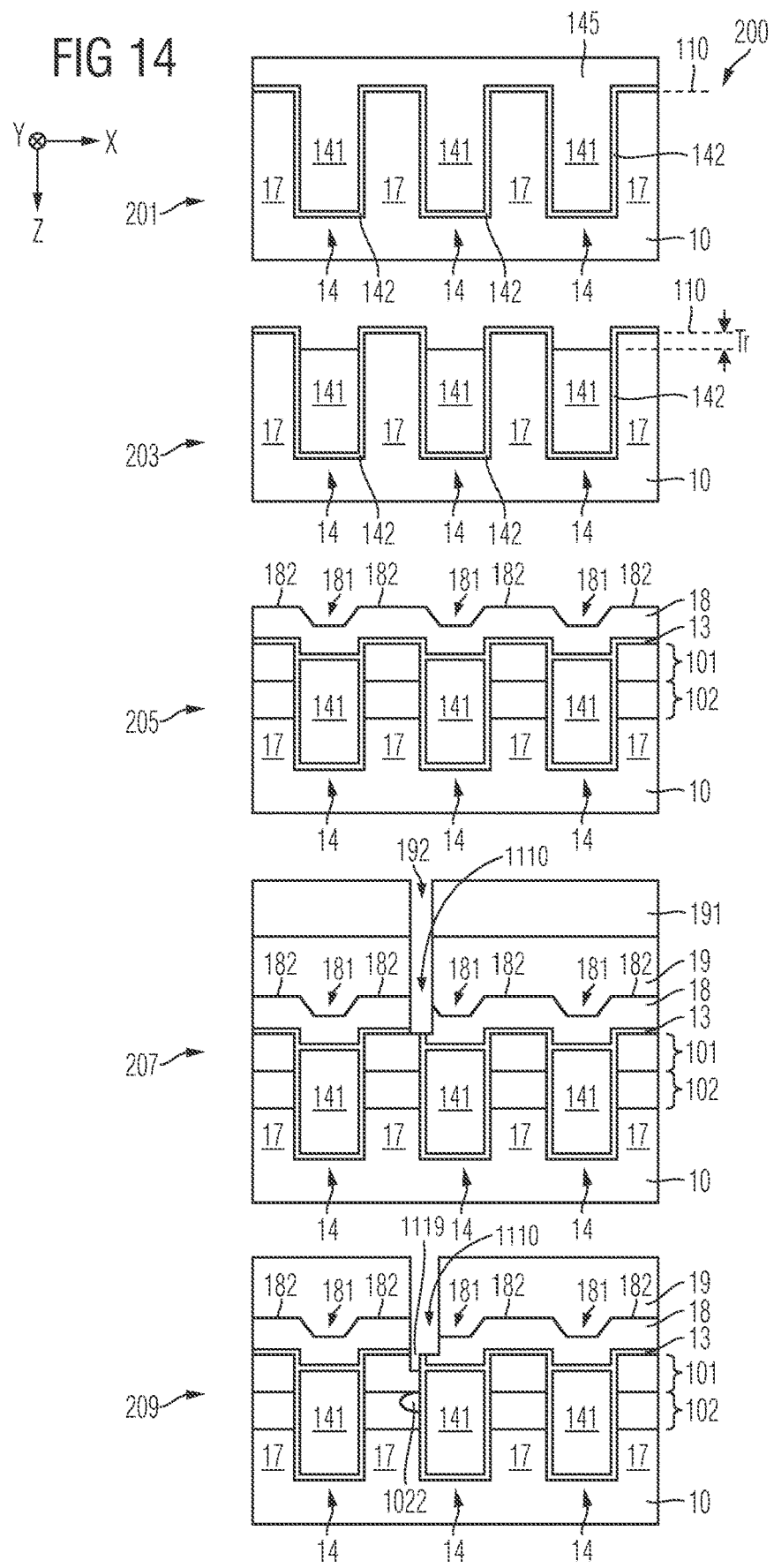
FIG. 14 schematically and exemplarily illustrates, based on corresponding schematically illustrated sections of some vertical cross-sections, a power semiconductor device production method in accordance with one or more embodiments.

Even though in FIG. 14 each trench is designated with reference numeral 14 and related subreference numerals 141, 142 . . . are used, it shall be understood that the illustrated method may likewise be implemented for different trench configurations and/or different mesa configurations, e.g., those illustrated in FIGS. 5-13.

In a next step 203, an upper portion of the deposited electrically conductive material 145 may be removed, e.g., the trench electrodes 141 may be recessed below the surface of the front side 110, e.g. for at least 50 nm (e.g., along at least 50 nm). During the removing process, the surfaces formed by the mesa portions 17, or, respectively parts of the trench insulators 142, are exposed. Thereby, the surfaces formed by the mesa portions 17 may build a part of the frontside surface 110. For example, a distance Tr along the vertical direction Z between the frontside surface 110 (i.e., semiconductor body surface) and the tops of the trench electrodes amounts to at least 50 nm, or to at least 100 nm.

After recessing, the source region 101 and the body region 102 may be formed in the mesa portions 17, which may include carrying out one or more implantation processing steps and related processing steps, such as temperature annealing processing steps and the like. Furthermore, at least one first insulation layer 13 may be provided above the trench electrodes 141 in step 205. E.g., the first insulation layer 13 is provided by carrying out an oxidation processing step. The first insulation layer 13 may be considered as an extension of the portions of the trench insulators 142 that were previously covering the mesa portions 17. Additionally, a second insulation 18 may be formed above the first insulation layer 13. E.g., the first insulation layer 13 is an oxide layer, and/or the second insulation layer 18 is a tetraethyl orthosilicate (TEOS) layer. The second insulation layer 18 may be thicker as compared to the first insulation layer 13. Furthermore, due to the recess distance Tr, an upper surface of the second insulation layer 18 may be structured in accordance with the trench electrodes 141; e.g., the second insulation layer 18 has several well portions 181 where the second insulation layer 18 laterally overlaps with the trench electrodes 141 and several plateau portions 182 where no such lateral overlap is present, as schematically illustrated.

In step 207, a third insulation layer 19 may be formed above the second insulation 18. E.g., the third insulation layer 19 may be a borophosphosilicate glass layer and/or may be thicker as compared to the second insulation 18. Furthermore, a mask 191 may be provided above the third insulation layer 19, having a mask opening 192. Then, a first contact hole 1110 through the third insulation layer 19, the second insulation layer 18 and the first insulation layer 13 is formed, wherein the first contact hole 1110 exposes a part of a surface of the mesa portion 17 adjacent to the one of the two trenches 14 laterally confining the mesa portion 17. In the illustrated example, only one mesa portion 17 is partially exposed; however, it is again referred to the embodiments according to FIGS. 5-13, which exemplify that many trench/mesa configurations are possible. Hence, for example, the mask 191 could also have one or more additional mask openings above other mesa portions 17 that shall be contacted. Forming the first contact hole 1110 may comprise an etching processing step. The mask 191 may be a resist layer.

In step 207, the position of the mask opening 192 can be determined based on previously carried out simulation and/or based on previous processing steps. With the determined mask opening 192, a selective etch processing step may be carried out for forming the first contact hole 1110, during which, e.g., only insulating material is etched but no semiconductor material.

In step 209, the mask 191 is removed. Furthermore, the first contact hole 1110 is extended into at least the vertical direction Z such that a contact groove 1119 is established within the mesa portion 17. Such hole extension may comprise a further etching processing step, for example another selective etching processing step, according to which only semiconductor material is etched but not insulating material. Thus, forming the contact groove 1119 can be carried out based on a self-aligned processing step in accordance with an embodiment. The formed contact groove 1119 interfaces with both the semiconductor source region 101 and the semiconductor body region 102 and also interfaces with the trench insulator 142 of one of the two trenches 14 that spatially confine the mesa portion 17. The formed contact groove 1119 is arranged spaced apart from the trench insulator 142 of the other one of the two trenches 14 that spatially confine the mesa portion 17. For example, when forming the first contact hole 1110 and the contact groove 1119, it is ensured that neither the trench insulator 142 at a sidewall of the trench electrode 141 of the adjacent trench 14 nor the portion of the first insulation layer 13 above the trench electrode 141 is removed. E.g., the contact groove 1119 shows a high selectivity to oxide and, hence, the groove contact can be etched self-aligned towards the neighboring trench 14 forming a small-width contact plug 111 which contacts both the source region (e.g., n+ region) and the contact portion 1022 (e.g., p+ region).

Step 209 further comprises forming, through the first contact hole 1110 and at the first contact groove 1119 in the semiconductor body region 102, the contact portion 1022 with the locally increased dopant concentration. This may for example include an implantation processing step; e.g., an implantation of BF2 ions, and related processing steps, such as a temperature annealing processing step, which may yield a structure as exemplified in FIG. 3. As an alternative to the implantation processing step, a deposition processing step may be employed, which may yield a structure of the contact portion 1022 as exemplified in FIG. 4. E.g., Bor, or another material, may be a dopant in either a previously provided, e.g., deposited, polycrystalline silicon region or in an amorphous region or in an oxide region, and may be diffused out of such region for producing the contact portion 1022. After the diffusion process, the doped region which has served as a solid source (i.e., the polycrystalline silicon region or amorphous region or oxide region) during the diffusion process may be removed.

Regarding exemplary dimensions, e.g., those of the contact groove 1119 and the contact portion 1022 of the body region 102, it is referred to the description above, e.g., with respect to FIGS. 3-4.

A further, non-illustrated step of method 200 may include depositing at least one electrically conductive material within the first contact hole 1110 and the contact groove 1119 for forming the contact plug 111 (cf. FIGS. 3 and 4). E.g., this may include forming a Ti/TiN layer first and afterwards depositing AlCu or another material for forming the contact plug 111.

In the above, embodiments pertaining to power semiconductor device, such as MOSFETs, IGBTs, RC IGBTs and derivatives thereof, and corresponding processing methods were explained. For example, these power semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A power semiconductor device, comprising:
a first load terminal at a first side, a second load terminal, and a semiconductor body coupled to the first load terminal and the second load terminal and configured to conduct a load current between the first load terminal and the second load terminal;
a plurality of trenches at the first side and extending into the semiconductor body along a vertical direction, wherein each trench of the plurality of trenches includes a trench electrode insulated from the semiconductor body by a trench insulator, wherein two of the plurality of trenches are arranged laterally adjacent to each other and spatially confine a mesa portion;
a first insulation layer formed above each trench electrode of the plurality of trenches;

a second insulation layer formed entirely above the first insulation layer and in contact with the first insulation layer;
a semiconductor source region in the mesa portion;
a semiconductor body region in the mesa portion;
a contact plug extending from the first side into the mesa portion, wherein the contact plug is arranged:
in direct contact with the first insulation layer and the second insulation layer;
in contact with both the semiconductor source region and the semiconductor body region;
in contact with the trench insulator of one of the two trenches that spatially confine the mesa portion; and
spaced apart from the trench insulator of the other one of the two trenches that spatially confine the mesa portion,
wherein an extension of overlap of the contact plug with the first insulation layer on a first side of the contact plug is different than an extension of overlap of the contact plug with the first insulation layer on a second, opposite side of the contact plug.

2. The power semiconductor device of claim 1, wherein the contact plug is electrically isolated from the trench electrode by the trench insulator of one of the two trenches that spatially confine the mesa portion.

3. The power semiconductor device of claim 1, wherein the contact between the contact plug and each of the semiconductor source region, the semiconductor body region and the trench insulator is established within the mesa portion.

4. The power semiconductor device of claim 1, wherein, in a region above the mesa portion, the contact plug laterally overlaps with the trench electrode of the trench whose trench insulator is contacted by the contact plug in the mesa portion.

5. The power semiconductor device of claim 1, wherein the contact plug includes a first lateral surface, a second lateral surface and a bottom surface, wherein the first lateral surface interfaces with the trench insulator, the bottom surface interfaces with the semiconductor body region and the second lateral surface interfaces with the semiconductor source region.

6. The power semiconductor device of claim 5, wherein a lateral distance in a first lateral direction between the second lateral surface and the trench insulator of the other trench amounts to at least 200 nm.

7. The power semiconductor device of claim 1, wherein a width of the mesa portion in the first lateral direction amounts to less than 600 nm.

8. The power semiconductor device of claim 1, wherein the semiconductor body region includes a contact portion with a locally increased dopant concentration, and wherein the contact plug contacts the contact portion.

9. The power semiconductor device of claim 8, wherein the contact portion is in contact with the trench insulator that is also contacted by the contact plug.

10. The power semiconductor device of claim 8, wherein the contact portion is spaced apart from the trench insulator of the other trench by a distance in the first lateral direction amounting to at least 20% of a width of the mesa portion in the first lateral direction.

11. The power semiconductor device of claim 1, wherein both trenches that laterally confine the mesa portion are control trenches and the trench electrodes of both trenches that laterally confine the mesa portion are control electrodes insulated from the first load terminal and configured to control the load current in the mesa portion.

12. The power semiconductor device of claim 11, wherein the control electrodes are connected to different electrical potentials at least during a control operation.

13. The power semiconductor device of claim 11, wherein at least one of the two trenches that laterally confine the mesa portion is a multi-trench-electrode trench.

14. The power semiconductor device of claim 1, wherein one of the two trenches that laterally confine the mesa portion is a control trench and the trench electrode of the one of the two trenches that laterally confine the mesa portion is a control electrode insulated from the first load terminal and configured to control the load current in the mesa portion, and wherein the other one of the two trenches is a source trench and the trench electrode of the other one of the two trenches is a source electrode electrically connected to the first load terminal.

15. The power semiconductor device of claim 14, wherein at least one of the two trenches that laterally confine the mesa portion is a multi-trench-electrode trench.

16. A power semiconductor device, comprising:
a first load terminal at a first side, a second load terminal, and a semiconductor body coupled to the first load terminal and the second load terminal and configured to conduct a load current between the first load terminal and the second load terminal;
a plurality of trenches at the first side and extending into the semiconductor body along a vertical direction, wherein each trench of the plurality of trenches includes a trench electrode insulated from the semiconductor body by a trench insulator, wherein two of the plurality of trenches are arranged laterally adjacent to each other and spatially confine a mesa portion;
a first insulation layer formed above each trench electrode of the plurality of trenches;
a semiconductor source region in the mesa portion;
a semiconductor body region in the mesa portion;
a contact plug extending from the first side into the mesa portion, wherein the contact plug is arranged:
in contact with both the semiconductor source region and the semiconductor body region;
in contact with the trench insulator of one of the two trenches that spatially confine the mesa portion; and
spaced apart from the trench insulator of the other one of the two trenches that spatially confine the mesa portion,
wherein both trenches that spatially confine the mesa portion are control trenches and the trench electrodes of both trenches that spatially confine the mesa portion are control electrodes insulated from the first load terminal and configured to control the load current in the mesa portion,
wherein at least one of the two trenches that spatially confine the mesa portion is a multi-trench-electrode trench, and
wherein an extension of overlap of the contact plug with the first insulation layer on a first side of the contact plug is different than an extension of overlap of the contact plug with the first insulation layer on a second, opposite side of the contact plug.

17. The power semiconductor device of claim 16, wherein the control electrodes are connected to different electrical potentials at least during a control operation.

* * * * *